United States Patent
Cheng et al.

(10) Patent No.: US 6,821,868 B2
(45) Date of Patent: Nov. 23, 2004

(54) METHOD OF FORMING NITROGEN ENRICHED GATE DIELECTRIC WITH LOW EFFECTIVE OXIDE THICKNESS

(75) Inventors: Juing-Yi Cheng, Kaoshung (TW); T. L. Lee, Hsinchu (TW); Chia Lin Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/330,850

(22) Filed: Dec. 27, 2002

(65) Prior Publication Data

US 2004/0126956 A1 Jul. 1, 2004

(51) Int. Cl.[7] .............................................. H01L 21/425
(52) U.S. Cl. ...................... 438/517; 438/768; 438/783; 257/405
(58) Field of Search ................................. 438/517, 287, 438/768–777, 783–794, 513–522; 257/405–410, 649, 376

(56) References Cited

U.S. PATENT DOCUMENTS

| | | | |
|---|---|---|---|
| 5,498,577 A | 3/1996 | Fulford, Jr. et al. | |
| 5,596,218 A | 1/1997 | Soleimani et al. | |
| 5,972,804 A | 10/1999 | Tobin et al. | |
| 6,013,553 A | 1/2000 | Wallace et al. | |
| 6,020,243 A | 2/2000 | Wallace et al. | |
| 6,096,597 A | 8/2000 | Tsu et al. | |
| 6,110,842 A | 8/2000 | Okuno et al. | |
| 6,207,489 B1 | 3/2001 | Nam et al. | |
| 6,291,866 B1 | 9/2001 | Wallace et al. | |
| 6,291,867 B1 | 9/2001 | Wallace et al. | |
| 6,297,173 B1 | 10/2001 | Tobin et al. | |
| 6,362,085 B1 | 3/2002 | Yu et al. | |
| 6,566,281 B1 * | 5/2003 | Buchanan et al. | 438/786 |
| 6,610,615 B1 * | 8/2003 | McFadden et al. | 438/776 |
| 6,649,538 B1 * | 11/2003 | Cheng et al. | 438/775 |
| 6,653,192 B1 * | 11/2003 | Ryoo | 438/275 |

* cited by examiner

*Primary Examiner*—Matthew Smith
*Assistant Examiner*—Calvin Lee
(74) *Attorney, Agent, or Firm*—Duane Morris LLP

(57) ABSTRACT

A method of forming a gate dielectric includes the steps of forming a gate oxide layer on a substrate, forming a buffer layer over the gate oxide layer and incorporating nitrogen into the gate oxide layer through the buffer layer. A semiconductor device having a gate structure is also provided. The gate includes a nitrogen enriched gate oxide layer formed on a substrate, a silicon nitride or poly-silicon buffer layer formed on the gate oxide layer and a gate electrode formed over the buffer layer.

24 Claims, 1 Drawing Sheet

METHOD OF FORMING NITROGEN ENRICHED GATE DIELECTRIC WITH LOW EFFECTIVE OXIDE THICKNESS

FIELD OF THE INVENTION

The present invention relates to methods of forming gate dielectric structures, and more particularly to methods of forming nitrogen enriched gate dielectric structures.

BACKGROUND OF THE INVENTION

As circuit designs become more complex and increased processing speeds are demanded, it is becoming increasingly more important and necessary to be able to provide larger numbers of transistors on an integrated circuit (IC) chip without increasing the overall size of the IC chip. One technique for increasing circuit density is to scale down the size of each individual MOSFET device on the IC chip. The performance of the MOSFET is inversely proportional to the gate oxide thickness. Efforts to enhance performance, therefore, have driven gate oxide thicknesses down below 14 Angstroms (Å). Scaling of the gate oxides to such thicknesses, however, leads to high tunneling current and boron penetration.

An alternative approach to extreme scaling of oxide thicknesses that improves device performance is the incorporation of nitrogen in the gate oxide. Gate oxide nitridation increases the dielectric constant of the gate dielectric over conventional silicon oxide, thereby reducing the effective oxide thickness while reducing gate leakage current and increasing boron penetration immunity. Several prior art nitridation processes are described in U.S. Pat. No. 5,596,218 to Soleimani et al., the entirety of which is hereby incorporated by reference herein, including nitridation using $NH_3$, $N_2O$ oxidation and $N_2$ implantation.

One method of incorporating nitrogen into the gate oxide layer is through direct implantation of nitrogen in a plasma treatment process. This process can yield high doses of nitrogen at a desired, controlled depth in the silicon oxide layer, but the process tends to damage the silicon oxide layer, resulting in low carrier mobility and low driving current. Therefore, there remains a need for a new method of incorporating nitrogen into a gate oxide without adversely affecting device performance. Still further, there remains a need for a new method of implanting nitrogen into a gate oxide while reducing or eliminating damage to the oxide layer.

SUMMARY OF THE INVENTION

A method of forming a gate dielectric includes the steps of forming a gate oxide layer on a substrate, forming a buffer layer over the gate oxide layer and incorporating nitrogen into the gate oxide layer through the buffer layer. A semiconductor device having a gate structure is also provided. The gate structure includes a nitrogen enriched gate oxide layer formed on a substrate, a silicon nitride or poly-silicon buffer layer formed on the gate oxide layer and a gate electrode formed over the buffer layer.

The method provides a nitrogen enriched gate dielectric structure without directly subjecting the gate oxide to damage associated with nitridation treatment. Low leakage current and high driving current devices can thereby be fabricated including gate dielectrics having a low effective oxide thickness. The fabrication method and semiconductor structure are particularly suited for 0.15 μm and smaller technology modes.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
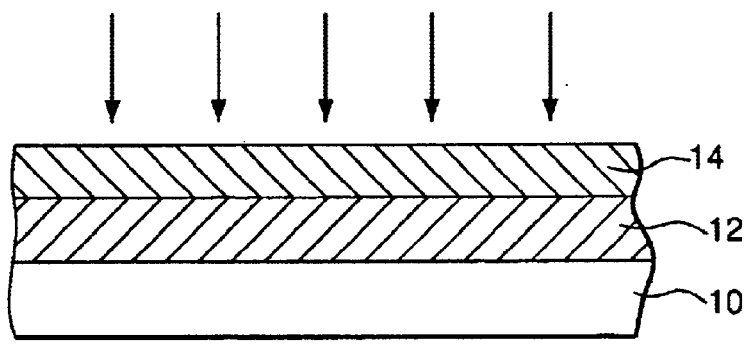
FIGS. 1–3 are cross sections illustrating process steps for forming a nitrogen enriched gate dielectric.
Figure 2:
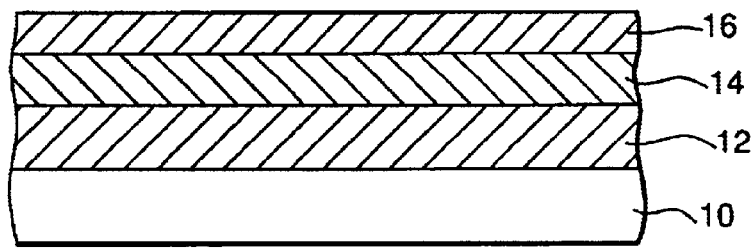
Figure 3:
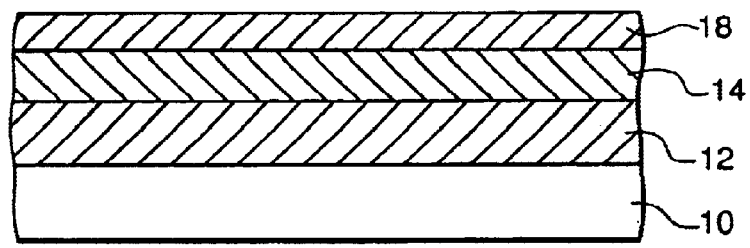

FIGS. 1–3 are cross sections illustrating an exemplary process for forming a nitrogen enriched gate dielectric and gate structure including a nitrogen enriched gate dielectric. Referring first to FIG. 1, a gate oxide layer 12 is formed on a substrate 10, such as a silicon, germanium or silicon on insulator (SOI) substrate. The gate oxide layer 12 may include a thin $SiO_2$, SiON or $SiON_2$ layer grown on the substrate 10. The gate oxide layer 12 preferably has a thickness of less than approximately 20 Å, and more preferably 17 Å. For purposes of this description, "effective oxide thickness" is defined as the thickness silicon oxide would have to be in order to have the same capacitance per unit area as the nitrided oxide. For the same effective oxide thickness, the physical thickness of a nitrided silicon oxide is thicker than the pure oxide without nitridation, due to the higher dielectric constant.

A buffer layer 14 is deposited over the gate oxide layer 12, such as by chemical vapor deposition. The buffer layer 14 may be a silicon nitride ($Si_3N_4$ (also referred to herein as SiN)) or polysilicon (poly-Si) layer, or even a silicon germanium or silicon carbon layer, having a thickness between approximately 20–1000 Å, and more preferably between about 50–500 Å. The buffer layer 14 serves as a protective layer for the gate oxide 12 during nitrogen implantation (describe below and shown in FIG. 1 by arrows) because the gate oxide 12 is not directly exposed to the nitridation process and, therefore, does not suffer nitridation related damage.

One exemplary implantation process is a remote plasma nitridation process, at a temperature between about 20–600° C. in ambient of $N_2$, $N_2O$ or NO, at a power between approximately 100–3000 Watts and a pressure between about 5 mTorr-760 Torr between about 5–300 seconds at a flow rate of between about 10–1000 sccm with an $N_2$ precursor and a substrate bias of between about 0.0–1.0 kilovolt. Other nitridation processes may also be utilized, such high density plasma nitridation, decouple plasma nitridation (DPN), or thermal nitridation using $NH_3$, $N_2O$ or NO oxidation.

Initially, the nitrogen ions are mostly implanted into the oxide layer through the buffer layer 14, but an amount of nitrogen remains in the buffer layer 14. After this step, the relative concentrations in atoms/cm$^2$ of the implanted nitrogen in the buffer and oxide layers, respectively, are $1 \times 10^{16}$ and less than $5 \times 10^{15}$ atoms/cm$^2$. The interface of the substrate 10 and the gate oxide layer 12 has almost no concentration of nitrogen.

After the nitrogen is implanted into the gate oxide layer 12, a thermal annealing process is performed to further drive the nitrogen from the buffer layer 14 and fix the nitrogen into the gate oxide layer 12. A rapid thermal anneal process is preferred at a temperature between approximately 900–1200° C., for a duration between approximately 5–120 seconds in a $N_2$, He, $O_2$, $N_2O$ or NO ambient.

During the annealing process and as shown in FIG. 2, a $SiO_2$ layer 16 grows on the SiN or poly-Si buffer layer 14. This oxide layer 16 is then etched from the gate dielectric structure using, for example, a HF etch process, in which diluted HF with concentration range from about 100:1 to 20:1 DI:HF at around 25° C. to 80° C. for about 5 to 90 seconds can be used, with the buffer layer 14 serving as an etch stop layer. For a SiN buffer layer, the final target thickness is preferably less than 10 Å. For a polysilicon buffer layer, the target thickness is preferably less than 20 Å.

After the etch process, which removes the native oxide 16 grown on the buffer layer 14, a gate 18 is formed on the exposed buffer layer 14. Before this formation step, a thermal treatment may be employed to further cure dielectric damage in order to improve dielectric quality. An exemplary gate 18 is formed from poly-Si by, for example, chemical vapor deposition techniques familiar to those of ordinary skill. If the buffer 14 is formed from poly-Si, it effectively becomes part of the gate in the final gate structure. If the buffer 14 is formed from SiN, it effectively becomes part of the gate dielectric of the final gate structure.

Both dielectric constant and EOT depend on nitrogen concentration. If the buffer layer is $Si_3N_4$, EOT is a factor of the total thickness of the base oxide and the silicon nitride buffer layer.

Figure 4:
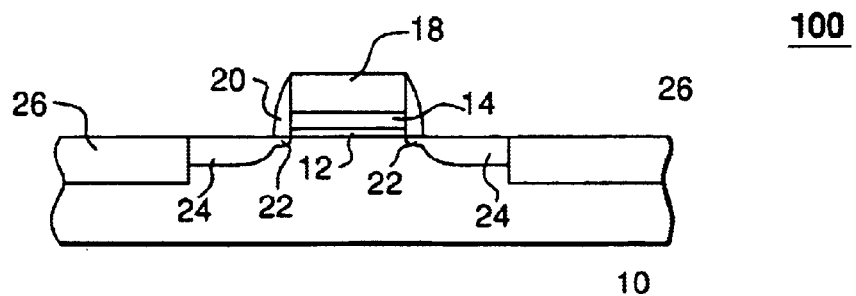
FIG. 4 is an illustration of an exemplary MOSFET device having a nitrogen enriched gate dielectric.

The above-described method of forming a gate structure with nitrogen enriched gate oxide may be utilized in forming several structures having nitrogen enriched gate dielectrics, such as MOSFETs, CMOS and bi-CMOS devices, and embedded DRAM structures. Configurations and methods of forming these structures are well known to those in the art and need not be described in detail. One exemplary structure is shown in FIG. 4. MOSFET 100 is shown formed on substrate 10 and is isolated from other devices by shallow trench isolation (STI) 26. The gate structure includes nitrogen enriched gate oxide 12, SiN or poly-Si buffer layer 14, and poly-Si gate electrode 18, formed, for example, as described above in connection with FIGS. 1–3. The device 100 also includes lightly doped regions 22 and more heavily doped source/drain regions 24. Spacers 20, usually of silicon oxide, are also provided. The gate and source/drain contact regions may also include metal silicide layers (not shown), such as titanium, tungsten, cobalt or nickel silicide regions. An interlayer dielectric layer is generally formed over the structure and contacts are formed to the device.

The method described above produces a nitrogen enriched gate dielectric structure without directly subjecting the gate oxide to nitrogen plasma treatment, thereby eliminating damage to the gate oxide normally resulting from nitridation treatment, particularly with direct plasma treatment of a gate oxide. Low leakage current and high driving current devices can thereby be fabricated including gate dielectrics having a low effective oxide thickness formed according to the above-described method. The methods and structure described herein are particularly suited for 0.15 μm and smaller processes. This process should apply as well to ultra thin gate dielectric applications having an EOT of less than 10 Å.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a gate dielectric, comprising the steps of:
   forming a gate oxide layer on a substrate;
   forming a buffer layer over said gate oxide layer; and
   incorporating nitrogen into said gate oxide layer through said buffer layer.

2. The method of claim 1, farther comprising the step of driving said nitrogen into said gate oxide layer and fixing said nitrogen in said gate oxide layer.

3. The method of claim 2, wherein said driving and fixing steps include the step of annealing said substrate.

4. The method of claim 3, wherein a second oxide layer is formed over said buffer layer during said annealing step, said method further comprising the step of removing said second oxide layer and exposing said buffer layer.

5. The method of claim 4, wherein said removing step includes a hydrogen fluoride etch.

6. The method of claim 3, wherein said annealing step is a rapid thermal anneal at a temperature between about 900–1200° C. for about 5–120 seconds.

7. The method of claim 1, wherein said buffer layer is a silicon nitride or poly-silicon layer.

8. The method of claim 1, wherein said incorporating step includes a remote plasma nitridation process.

9. The method of claim 1, wherein said gate oxide is a silicon oxide layer and has a thickness of less than approximately 20 Å.

10. The method of claim 1, Wherein said incorporating step includes a remote plasma nitridation process, a high density plasma nitridation process, a decouple plasma nitridation process or a thermal nitridation process.

11. A semiconductor device having a gate structure, said gate structure including a nitrogen enriched gate oxide layer formed over a substrate, a silicon nitride or poly-silicon buffer layer formed on said gate oxide layer and a gate electrode formed over said buffer layer, wherein said nitrogen being implanted into said gate oxide layer through said buffer layer such that said gate oxide layer is substantially free from damage associated with said implantation.

12. The semiconductor device of claim 11, wherein said gate oxide layer is a silicon oxide layer having a thickness of less than approximately 20 Å.

13. The semiconductor device of claim 12, wherein said semiconductor device is a MOSFET device and said gate electrode includes poly-silicon.

14. The semiconductor device of claim 12, wherein said buffer layer has a thickness between approximately 20–1000 Å.

15. The semiconductor device of claim 12, wherein said buffer layer has a thickness between approximately 50–500 Å.

16. A method of forming a gate structure of a semiconductor device, comprising the stops of;
   forming a silicon oxide gate oxide layer on a silicon substrate, said gate oxide layer having a thickness of less than approximately 20 Å;
   forming a buffer layer over said gate oxide layer;
   implanting nitrogen into said gate oxide layer through said buffer layer using a plasma nitridation process;
   driving said nitrogen into said gate oxide layer and fixing said nitrogen in said gate oxide layer; and
   forming a gate electrode over said buffer layer.

17. The method of claim 16, wherein said driving and fixings steps include the step of annealing said substrate.

18. The method of claim 17, wherein said annealing step is a rapid thermal anneal at a temperature between about 900–1200° C. for about 5–120 seconds.

19. The method of claim 17, wherein a second oxide layer is formed over said buffer layer during said annealing step, said method further comprising the step of removing said second oxide layer before forming said gate electrode.

20. The method of claim 19, wherein said removing step includes a hydrogen fluoride etch.

21. The method of claim 16, wherein said buffer layer is a silicon nitride or poly-silicon layer.

22. The method of claim 16, wherein said plasma nitridation process is selected from the group consisting of remote plasma nitridation, high density plasma nitridation, and decouple plasma nitridation.

23. A semiconductor device having a gate structure, said gate structure including a nitrogen enriched gate oxide layer formed over a substrate, a buffer layer formed on said gate oxide layer, said nitrogen being incorporated into said gate oxide layer through said buffer layer, and a gate electrode fanned over said buffer layer.

24. The device of claim 23, wherein said nitrogen enriched gate oxide layer is substantially free from damage associated with incorporating said gate oxide layer with nitrogen.

* * * * *

UNITED STATES PATENT AND TRADEMARK OFFICE
CERTIFICATE OF CORRECTION

PATENT NO. : 6,821,868 B2
DATED : November 23, 2004
INVENTOR(S) : Juing-Yi Chang, T.L. Lee and Chia Lin Chen It is certified that error appears in the above-identified patent and that said Letters Patent is hereby corrected as shown below:

Column 4,
Line 10, delete "farther" and insert therefor -- further --;
Line 31, delete "Wherein" and insert therefor -- wherein --;
Line 56, delete "stops" and insert therefor -- steps --; and Column 6,
Line 8, delete "fanned" and insert therefor -- formed --.

Signed and Sealed this

Thirty-first Day of May, 2005

JON W. DUDAS
*Director of the United States Patent and Trademark Office*